United States Patent
Park

(10) Patent No.: US 8,853,719 B2
(45) Date of Patent: Oct. 7, 2014

(54) SEMICONDUCTOR LIGHT-EMITTING DEVICE AND LIGHT-EMITTING DEVICE PACKAGE HAVING THE SAME

(75) Inventor: Hyung Jo Park, Gwangju (KR)

(73) Assignee: LG Innotex Co., Ltd., Seoul (KR)

( * ) Notice: Subject to any disclaimer, the term of this patent is extended or adjusted under 35 U.S.C. 154(b) by 260 days.

(21) Appl. No.: 12/647,827

(22) Filed: Dec. 28, 2009

(65) Prior Publication Data

US 2010/0163904 A1    Jul. 1, 2010

(30) Foreign Application Priority Data

Dec. 29, 2008    (KR) .................. 10-2008-0135989

(51) Int. Cl.
*H01L 33/00*    (2010.01)
*H01L 33/44*    (2010.01)
*H01L 33/20*    (2010.01)
*H01L 33/38*    (2010.01)

(52) U.S. Cl.
CPC ............. *H01L 33/44* (2013.01); *H01L 33/20* (2013.01); *H01L 33/38* (2013.01); *H01L 33/0079* (2013.01)
USPC ..................................... 257/98; 257/E33.065

(58) Field of Classification Search
CPC ..... H01L 33/0079; H01L 33/20; H01L 33/38; H01L 33/44
USPC .............. 257/98, E33.062, E33.065
See application file for complete search history.

(56) References Cited

U.S. PATENT DOCUMENTS

| | | | | |
|---|---|---|---|---|
| 7,135,709 B1 * | 11/2006 | Wirth et al. | | 257/95 |
| 2003/0222269 A1 | 12/2003 | Lin et al. | | 257/99 |
| 2006/0110839 A1 * | 5/2006 | Dawson et al. | | 438/22 |
| 2006/0231852 A1 * | 10/2006 | Kususe et al. | | 257/99 |
| 2006/0278886 A1 * | 12/2006 | Tomoda et al. | | 257/99 |
| 2007/0096110 A1 | 5/2007 | Kato et al. | | 257/79 |
| 2008/0230791 A1 * | 9/2008 | Lin et al. | | 257/91 |
| 2008/0251808 A1 | 10/2008 | Kususe et al. | | 257/98 |
| 2009/0026468 A1 | 1/2009 | Sakai et al. | | 257/88 |
| 2012/0025256 A1 | 2/2012 | Kususe et al. | | |

FOREIGN PATENT DOCUMENTS

| | | |
|---|---|---|
| CN | 1376315 A | 10/2002 |
| CN | 1672271 A | 9/2005 |
| EP | 1 553 640 A1 | 7/2005 |
| EP | 1 662 587 A2 | 5/2006 |
| JP | 61-006880 A | 1/1986 |
| JP | 2004-71644 | 3/2004 |
| JP | 2005-276899 A | 10/2005 |
| JP | 2007-258338 A | 10/2007 |

(Continued)

OTHER PUBLICATIONS

Korean Office Action dated Nov. 15, 2010 issued in Application No. 10-2008-0135989.
European Search Report dated Apr. 6, 2010 for Application No. 09 180 745.3.

(Continued)

*Primary Examiner* — Shaun Campbell
(74) *Attorney, Agent, or Firm* — Ked & Associates, LLP

(57) ABSTRACT

Provided are a semiconductor light-emitting device and a light-emitting device package having the same. The semiconductor light-emitting device comprises a light-emitting structure, a first electrode unit, and a second electrode layer. The light-emitting structure comprises a plurality of compound semiconductor layers having a rounded side surface at an outer edge. The first electrode unit is disposed on the light-emitting structure. The second electrode layer is disposed under the light-emitting structure.

20 Claims, 9 Drawing Sheets

(56) References Cited

FOREIGN PATENT DOCUMENTS

| KR | 10-2005-0070459 A | 7/2005 |
| KR | 10-2008-0077294 A | 8/2008 |
| TW | 200845430 | 11/2008 |
| WO | WO 2004/070844 A1 | 8/2004 |
| WO | WO 2007/148866 A1 | 12/2007 |

OTHER PUBLICATIONS

Korean Office Action dated Jul. 26, 2011 issued in Application No. 10-2008-0135989.
Japanese Office Action for Application 2009-299132 dated Nov. 29, 2011.
Chinese Office Action dated Apr. 12, 2012 for Application 200910258875.0.

* cited by examiner

SEMICONDUCTOR LIGHT-EMITTING DEVICE AND LIGHT-EMITTING DEVICE PACKAGE HAVING THE SAME

CROSS-REFERENCE TO RELATED APPLICATIONS

The present application claims priority under 35 U.S.C. 119 and 35 U.S.C. 365 to Korean Patent Application No. 10-2008-00135989 (filed on Dec. 29, 2008), which is hereby incorporated by reference in its entirety.

BACKGROUND

The present disclosure relates to a semiconductor light-emitting device and a light-emitting device package having the same.

The present disclosure relates to a semiconductor light-emitting device and a method for fabricating the same.

Due to their physical and chemical characteristic, Group III-V nitride semiconductors are being esteemed as core materials for light-emitting devices such as light-emitting diodes (LEDs) and laser diodes (LDs). An example of the Group III-V nitride semiconductors is a nitride semiconductor with a composition equation of $In_xAl_yGa_{1-x-y}N$ ($0 \leq x \leq 1$, $0 \leq y \leq 1$, $0 \leq x+y \leq 1$).

An LED is a kind of semiconductor device that is used as a light source or uses the characteristics of compound semiconductors to converts electricity into light or ultraviolet (UV) rays to exchange signals.

Nitride semiconductor based LEDs or LDs are widely used in light-emitting devices, and are applied as light sources for various products such as keypad light-emitting units of mobile phones, electric light panels, and illumination devices.

SUMMARY

Embodiments provide a cylindrical semiconductor light-emitting device or a semiconductor light-emitting device with rounded edges and a light-emitting device package having the same.

Embodiments provide a cylindrical semiconductor light-emitting device or a pillar-type semiconductor light-emitting device with at least one rounded edge and a light-emitting device package having the same.

Embodiments provide a semiconductor light-emitting device capable of improving the far field beam distribution by a cylindrical light-emitting structure, and a light-emitting device package having the same.

An embodiment provides a semiconductor light-emitting device comprising: a light-emitting structure comprising a plurality of compound semiconductor layers having a rounded side surface at an outer edge; a first electrode unit on the light-emitting structure; and a second electrode layer under the light-emitting structure.

An embodiment provides a semiconductor light-emitting device comprising: a cylindrical light-emitting structure comprising a plurality of compound semiconductor layers; a polygonal second electrode layer under the light-emitting structure; a first electrode pad on the light-emitting structure; and a loop-type pattern disposed along the top edge of the light-emitting structure and connected electrically to the first electrode pad.

An embodiment provides a light-emitting device package comprises: a cylindrical light-emitting device comprising: a plurality of compound semiconductor layers comprising a first conductivity type semiconductor layer, an active layer and a second conductivity type semiconductor layer; a non-spherical second electrode layer under the second conductivity type semiconductor layer; and a first electrode unit on the first conductivity type semiconductor layer; a body unit having an opened cavity at the top; and a plurality of lead electrodes disposed in the cavity of the body unit and connected electrically to the first electrode unit and the second electrode layer.

The details of one or more embodiments are set forth in the accompanying drawings and the description below. Other features will be apparent from the description and drawings, and from the claims.

DETAILED DESCRIPTION OF THE EMBODIMENTS

Figure 1:
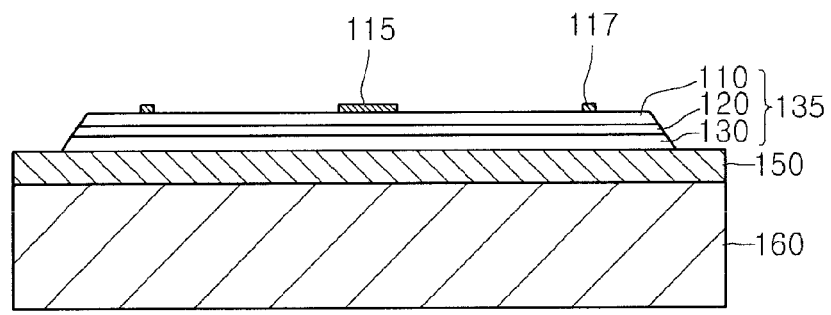
FIG. 1 is a side sectional view of a semiconductor light-emitting device according to an embodiment 1.

Reference will now be made in detail to the embodiments of the present disclosure, examples of which are illustrated in the accompanying drawings.

In the description of embodiments, the reference about 'on' and 'under' each layer will be made on the basis of the drawings. In the drawings, the dimension of each of elements may be exaggerated for clarity of illustration, and the dimension of each of the elements may be different from the actual dimension of each of the elements.

In the descriptions of embodiments, it will be understood that when a layer (or film), a region, a pattern, or a structure is referred to as being "on/under" a substrate, a layer (or film), a region, a pad, or patterns, it can be directly on the substrate, the layer (or film), the region, the pad, or the patterns, or intervening layers may also be present.

Figure 2:
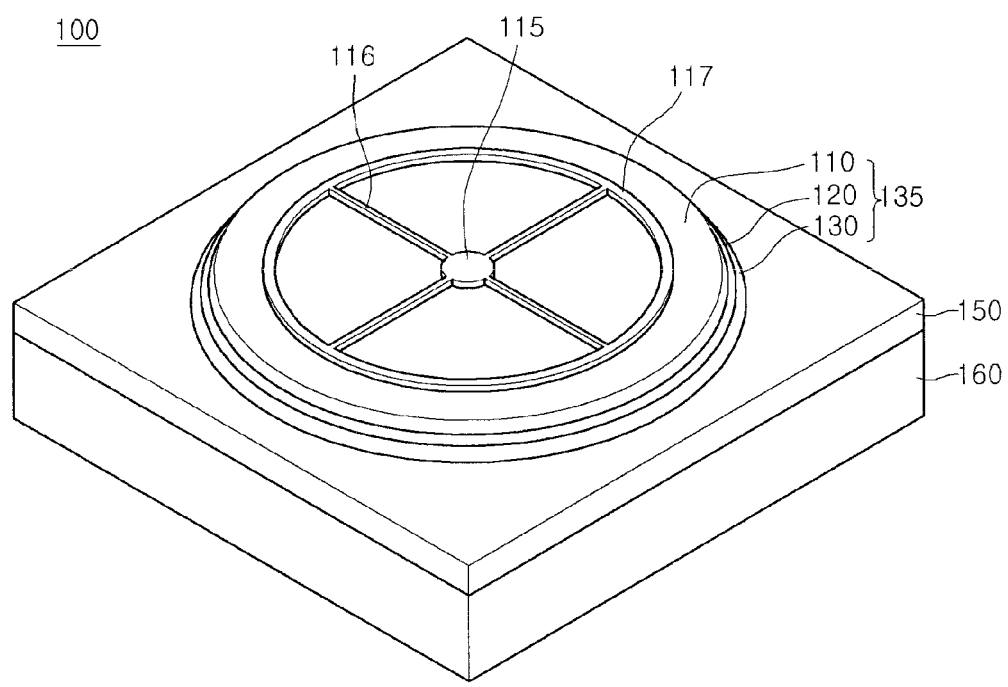
FIG. 2 is a perspective view of the semiconductor light-emitting device of FIG. 1.
Figure 3:
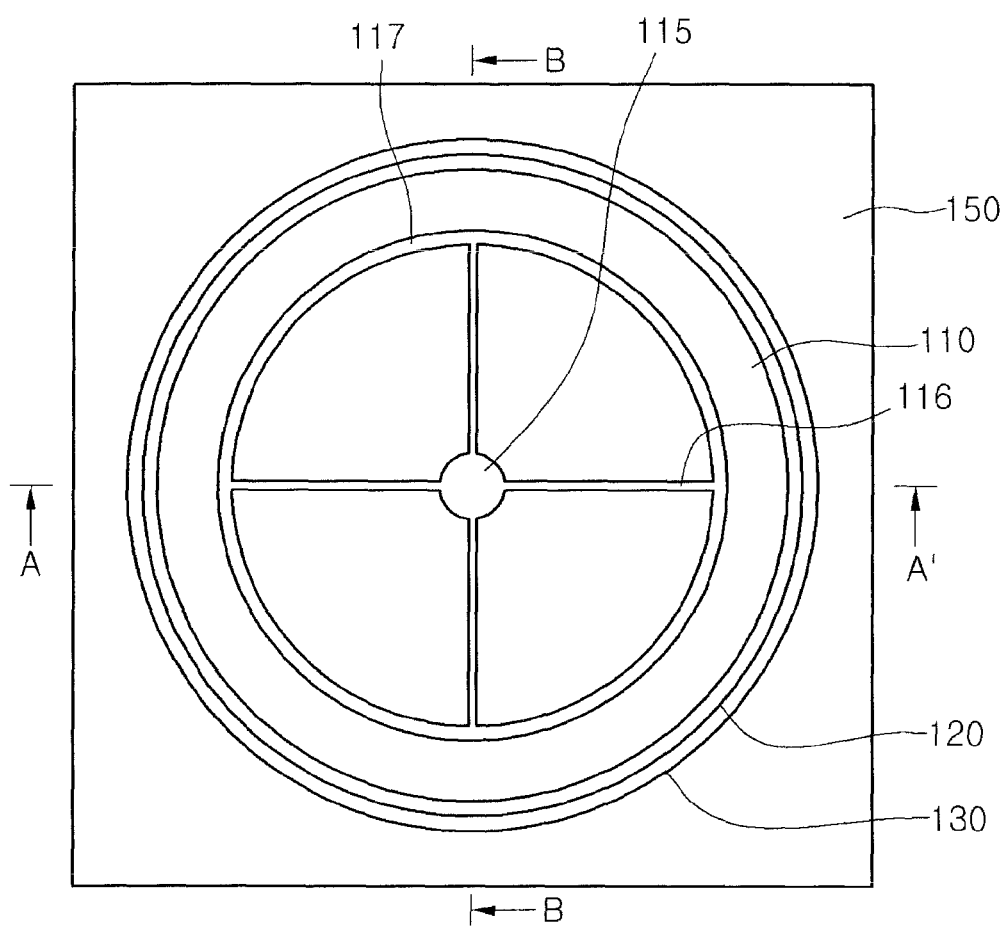
FIG. 3 is a plan view of the semiconductor light-emitting device of FIG. 1.

FIG. 1 is a side sectional view of a semiconductor light-emitting device according to an embodiment 1. FIG. 2 is a perspective view of the semiconductor light-emitting device of FIG. 1. FIG. 3 is a plan view of the semiconductor light-emitting device of FIG. 1.

Referring to FIGS. 1 to 3, a semiconductor light-emitting device 100 includes a first conductivity type semiconductor layer 110, a first electrode unit 115/116/117, an active layer 120, a second conductivity type semiconductor layer 130, a second electrode layer 150, and a conductive support member 160.

The semiconductor light-emitting device 100 may include a plurality of compound semiconductor layers, for example, a light-emitting diode (LED) using a Group III-V compound semiconductor. The LED may be an ultraviolet (UV) LED or a color LED that emits blue, green or red light. The emission light of the LED may be implemented variously within the technical scope of embodiments.

The compound semiconductor layers include a light-emitting structure 135. The light-emitting structure 135 includes the first conductivity type semiconductor layer 110, the active layer 120, and the second conductivity type semiconductor layer 130.

The first conductivity type semiconductor layer 110 may be formed of a Group III-V compound semiconductor doped with a first conductivity type dopant, for example, at least one selected from the group consisting of GaN, AlN, AlGaN, InGaN, InN, InAlGaN, AlInN, AlGaAs, GaP, GaAs, GaAsP, and AlGaInP. If the first conductivity type is an N type, the first conductivity type dopant may include an N-type dopant such as Si, Ge, Sn, Se, and Te. The first conductivity type semiconductor layer 110 may be formed in the shape of a disk, and a roughness pattern may be formed on the first conductivity type semiconductor layer 110. The first conductivity type semiconductor layer 110 may be formed in a single-layer structure or a multi-layer structure, to which the inventive concept is not limited.

The first electrode unit 115/116/117 may be formed on the first conductivity type semiconductor layer 110. The first electrode unit 115/116/117 may be formed in a predetermined shape or in a predetermined pattern.

Referring to FIG. 2, the first electrode unit includes a first electrode pad 115, a first pattern 116, and a second pattern 117. The first electrode pad 115 may be formed in singularity or in plurality. If the first electrode pad 115 is formed in plurality, they may be spaced apart from and electrically connected to each other.

The first electrode pad 115 may be disposed at a central portion on the first conductivity type semiconductor layer 110. The first pattern 116 may be formed in a branch pattern or in a radiation pattern. The first pattern 116 may be branched outward from the first electrode pad 115 in at least one branch or radiation pattern. The second pattern 117 may be connected to the end of the first pattern 116, and may be formed in the shape of a circle, a ring or a loop (e.g., an open loop or a closed loop).

The second pattern 117 may be connected through the first pattern 116 to the first electrode pad 115, and may be formed in the shape of a circle, a ring or a loop (e.g., an open loop or a closed loop) like the outer circumference of the light-emitting structure 135. The power applied through the first electrode pad 115 may be supplied to the first conductivity type semiconductor layer 110 through the first pattern 116 and the second pattern 117 in uniform distribution.

The active layer 120 may be formed under the first conductivity type semiconductor layer 110. The active layer 120 may be formed in a single or multiple quantum well structure. The active layer 120 may be formed of a group III-V compound semiconductor material to have the period of a well layer and a barrier layer, for example, an InGaN well layer/a GaN barrier layer or an InGaN well layer/an AlGaN barrier layer. A conductive clad layer may be formed on and/or under the active layer 120. The conductive clad layer may be formed of a GaN-based semiconductor.

The second conductivity type semiconductor layer 130 may be formed under the active layer 120. The second conductivity type semiconductor layer 130 may be formed of a Group III-V compound semiconductor doped with a second conductivity type dopant, for example, at least one selected from the group consisting of GaN, AlN, AlGaN, InGaN, InN, InAlGaN, AlInN, AlGaAs, GaP, GaAs, GaAsP, and AlGaInP. If the second conductivity type is a P type, the second conductivity type dopant may include a P-type dopant such as Mg, Be, and Zn. The second conductivity type semiconductor layer 130 may be formed in a single-layer structure or a multi-layer structure, to which the inventive concept is not limited.

In the light-emitting structure 135, a third conductivity type semiconductor layer may be formed under the second conductivity type semiconductor layer 130. The third conductivity type semiconductor layer may be formed of a semiconductor having the opposite polarity to that of the second conductivity type semiconductor layer 130. Also, the first conductivity type semiconductor layer 110 may be a P-type semiconductor layer, and the second conductivity type semiconductor layer 130 may be an N-type semiconductor layer. Accordingly, the light-emitting structure 135 may include at least one of an N-P junction structure, a P-N junction structure, an N-P-N junction structure, and a P-N-P junction.

The semiconductor layers 110, 120 and 130 may be formed in the shape of a disk, and the light-emitting structure 135 may be formed in the shape of cylinder or a pillar. The outer circumference of the light-emitting structure 135 may be formed to be slant or perpendicular. The light-emitting structure 135 may include at least one of an N-P junction structure, a P-N junction structure, an N-P-N junction structure, and a P-N-P junction.

If the outer circumference of the light-emitting structure 135 has a slant structure, the first conductivity type semiconductor layer 110, the active layer 120 and the second conductivity type semiconductor layer 130 may be formed to have different diameters. For example, the first conductivity type semiconductor layer 110 may be formed to have the smallest diameter, and the second conductivity type semiconductor layer 130 may be formed to have the largest diameter. The second electrode layer 150 is formed under the second conductivity type semiconductor layer 130 or the third conductivity type semiconductor layer. The second electrode layer 150 may be formed in the shape of a polygonal plate, and may be formed to have a diameter larger than the diameter of the second conductivity type semiconductor layer 130. Hereinafter, for convenience in description, it is assumed that the second conductivity type semiconductor layer 130 is the lowermost layer of the light-emitting structure 135.

The second electrode layer 150 may be formed of at least one of seed material, ohmic material, and reflective material. The second electrode layer 150 may serve a reflective electrode layer, and may be formed of one selected from the group consisting of Ag, Ni, Al, Rh, Pd, Ir, Ru, Mg, Zn, Pt, Au, Hf, and a combination thereof. The second electrode layer 150 may be formed to a thickness of several μm or less.

Also, an ohmic contact layer (not illustrated) may be formed between the second electrode layer 150 and the second conductivity type semiconductor layer 130 in the shape of a layer or a pattern. The ohmic contact layer may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, RuOx, $RuO_x$/ITO, Ni/$IrO_x$/Au, and Ni/$IrO_x$/Au/ITO.

A non-metallic layer may be formed between the second electrode layer 150 and the second conductivity type semiconductor layer 130 to control the electrical characteristics of the contact region. For example, the non-metallic layer may be formed of at least one of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, $IrO_x$, and $RuO_x$. The non-metallic layer may be formed to include a layer or a plurality of patterns.

The conductive support member 160 may be formed under the second electrode layer 150, and may be formed to have the same outer shape as the second electrode layer 150, to which the inventive concept is not limited. The conductive support member 160 serves as a base substrate, and may be formed of at least one of copper (Cu), aurum (Au), nickel (Ni), molybdenum (Mo), copper-tungsten (Cu—W), and carrier wafer such as Si, Ge, GaAs, ZnO, SiC, SiGe, and GaN. The conductive support member 160 may be formed by electrolytic plating or in a sheet shape, to which the inventive concept is not limited. The second electrode layer 150 and the conductive support member 160 may serve as a second electrode unit including a reflective electrode.

An adhesive layer may be formed between the second electrode layer 150 and the conductive support member 160. The adhesive layer may include at least one of Ti, Au, Sn, Ni, Cr, Ga, In, Bi, Cu, Ag, and Ta.

According to the embodiment 1, the active layer 120 is formed in the shape of a disk, thereby making it possible to prevent a current concentration and improve the internal quantum efficiency and the reliability of the chip.

Referring to FIG. 3, the semiconductor light-emitting device is symmetrical between an A-A section and a B-B section of FIG. 1. Accordingly, the first pattern 116 and the second pattern 117 may be symmetrical on the first electrode pad 115, and a uniform current may be supplied by the symmetrical structure to the first conductivity type semiconductor layer 110. In the semiconductor light-emitting device 100, a rounded light-emitting structure 135 may be formed on the second electrode layer 150, thus improving the far field beam distribution.

Figure 4:
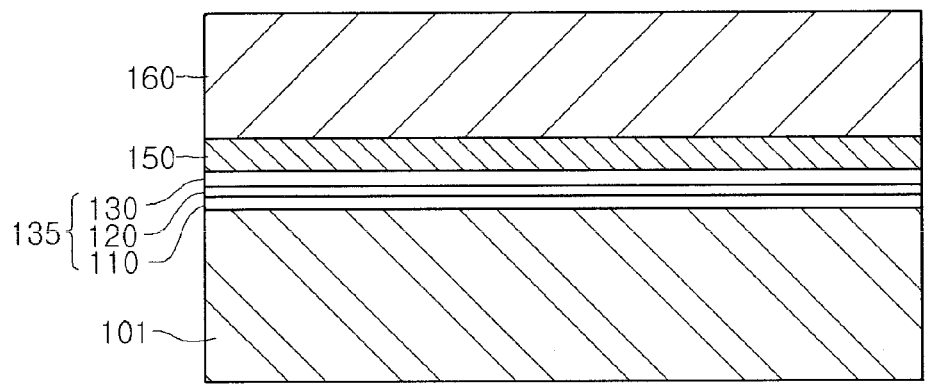
FIGS. 4 to 6 are sectional views illustrating a process for fabricating a semiconductor light-emitting device according to an embodiment 1.
Figure 5:
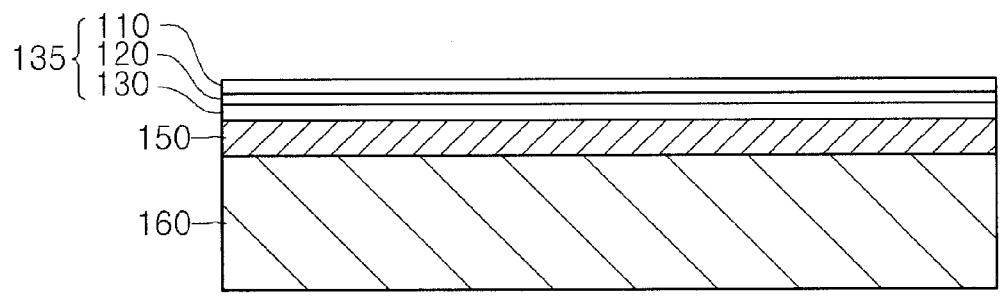
Figure 6:
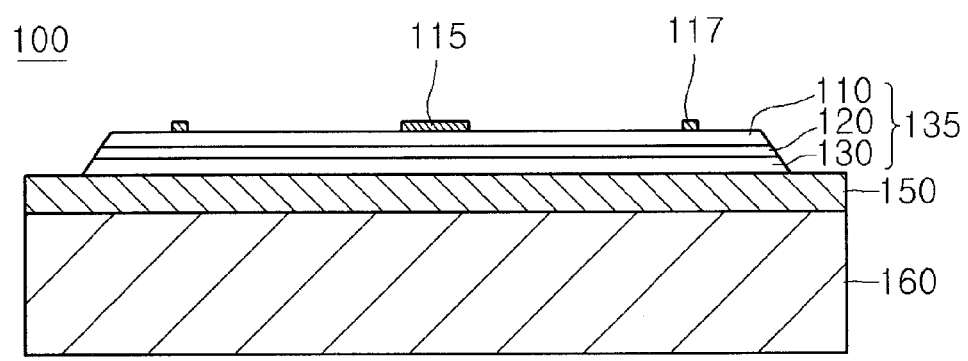

FIGS. 4 to 6 are sectional views illustrating a process for fabricating a semiconductor light-emitting device according to an embodiment 1.

Referring to FIG. 4, a substrate 101 is loaded into a growth equipment, and a Group II to VI compound semiconductor layer may be formed thereon.

The substrate 101 may be formed using at least one of sapphire ($Al_2O_3$) SiC, Si, GaAs, GaN, ZnO, GaP, InP, and Ge, or using a conductive substrate or a dielectric substrate.

The growth equipment may use an electron beam evaporator, PVD (physical vapor deposition), CVD (chemical vapor deposition), PLD (plasma laser deposition), a dual-type thermal evaporator, sputtering, or MOCVD (metal organic chemical vapor deposition), to which the inventive concept is not limited.

A buffer layer (not illustrated) and/or an undoped semiconductor layer (not illustrated) may be formed on the substrate 101. The buffer layer may be formed of a Group III-V compound semiconductor, for example, at least one of GaN, InN, AlN, InGaN, AlGaN, InAlGaN, and AlInN. Also, the buffer layer may be formed of a Group II to VI compound semiconductor, for example, a layer or a plurality of patterns of an oxide material such as ZnO. The undoped semiconductor layer may be formed on the buffer layer. The undoped semiconductor layer may be formed of an undoped GaN-based semiconductor. Hereinafter, for convenience in description, it is assumed that a first conductivity type semiconductor layer 110 is formed on the substrate 101.

A light-emitting structure 135 is formed on the substrate 101, and includes a plurality of compound semiconductor layers. The light-emitting structure 135 includes a first conductivity type semiconductor layer 110, an active layer 120 and a second conductivity type semiconductor layer 130 that are grown with a Group III-V compound semiconductor.

The first conductivity type semiconductor layer 110 is formed on the substrate 101. The first conductivity type semiconductor layer 110 may be formed of a Group III-V compound semiconductor doped with a first conductivity type dopant, for example, at least one selected from the group consisting of GaN, AlN, AlGaN, InGaN, InN, InAlGaN, AlInN, AlGaAs, GaP, GaAs, GaAsP, and AlGaInP. If the first conductivity type is an N type, the first conductivity type dopant may include an N-type dopant such as Si, Ge, Sn, Se, and Te. The first conductivity type semiconductor layer 110 may be formed in a single-layer structure or a multi-layer structure, to which the inventive concept is not limited.

The active layer 120 may be formed on the first conductivity type semiconductor layer 110. The active layer 120 may be formed in a single or multiple quantum well structure. The active layer 120 may be formed of a group III-V compound semiconductor material to have the period of a well layer and a barrier layer, for example, an InGaN well layer/a GaN barrier layer or an InGaN well layer/an AlGaN barrier layer to which the inventive concept is not limited. A conductive clad layer may be formed on and/or under the active layer 120. The conductive clad layer may be formed of a GaN-based semiconductor.

The second conductivity type semiconductor layer 130 may be formed on the active layer 120. The second conductivity type semiconductor layer 130 may be formed of a Group III-V compound semiconductor doped with a second conductivity type dopant, for example, at least one selected from the group consisting of GaN, AlN, AlGaN, InGaN, InN, InAlGaN, AlInN, AlGaAs, GaP, GaAs, GaAsP, and AlGaInP. If the second conductivity type is a P type, the second conductivity type dopant may include a P-type dopant such as Mg, Be, and Zn. The second conductivity type semiconductor layer 130 may be formed in a single-layer structure or a multi-layer structure, to which the inventive concept is not limited.

In the light-emitting structure 135, a third conductivity type semiconductor (not illustrated) layer may be formed on the second conductivity type semiconductor layer 130. The third conductivity type semiconductor layer may be formed of a semiconductor having the opposite polarity to that of the second conductivity type semiconductor layer 130. Also, the first conductivity type semiconductor layer 110 may be a P-type semiconductor layer, and the second conductivity type semiconductor layer 130 may be an N-type semiconductor layer. Accordingly, the light-emitting structure 135 may include at least one of an N-P junction structure, a P-N junction structure, an N-P-N junction structure, and a P-N-P junction. Hereinafter, for convenience in description, it is assumed that the second conductivity type semiconductor layer 130 is the uppermost layer of the light-emitting structure 135.

A second electrode layer 150 may be formed on the light-emitting structure 135, and a conductive support member 160 may be formed on the second electrode layer 150.

The second electrode layer 150 may be formed an inner region or the entire region on the second conductivity type semiconductor layer 130. The second electrode layer 150 may be at least one of seed metal, ohmic metal, and reflective metal. The second electrode layer 150 may serve a reflective electrode layer, and may be formed of one selected from the group consisting of Ag, Ni, Al, Rh, Pd, Ir, Ru, Mg, Zn, Pt, Au, Hf, and a combination thereof. Herein, an ohmic contact layer (not illustrated) may be formed between the second electrode layer 150 and the second conductivity type semiconductor layer 130 in the shape of a pattern.

The ohmic contact layer may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), $IrO_x$, RuOx, $RuO_x$/ITO, Ni/$IrO_x$/Au, and Ni/$IrO_x$/Au/ITO.

A non-metallic layer may be formed between the second electrode layer 150 and the second conductivity type semiconductor layer 130 to control the electrical characteristics of the contact region. For example, the non-metallic layer may be formed of at least one of $SiO_2$, $SiO_x$, $SiO_xN_y$, $Si_3N_4$, $Al_2O_3$, $TiO_2$, ITO, IZO, IZTO, IAZO, IGZO, IGTO, AZO, ATO, GZO, $IrO_x$, and $RuO_x$. The non-metallic layer may be formed to include a layer or a plurality of patterns.

The conductive support member 160 may be formed on the second electrode layer 150. The conductive support member 160 may be formed of at least one of copper (Cu), aurum (Au), nickel (Ni), molybdenum (Mo), copper-tungsten (Cu—W), and carrier wafer such as Si, Ge, GaAs, ZnO, SiC, SiGe, and GaN. The conductive support member 160 may be formed by electrolytic plating or in a sheet shape, and may be formed to a thickness of about 30~150 μm, to which the inventive concept is not limited.

The second electrode layer 150 and the conductive support member 160 may serve as a second electrode unit including a reflective electrode.

An adhesive layer may be formed between the second electrode layer 150 and the conductive support member 160. The adhesive layer may include at least one of Ti, Au, Sn, Ni, Cr, Ga, In, Bi, Cu, Ag, and Ta.

Referring to FIGS. 4 and 5, when the conductive support member 160 is formed, the conductive support member 160 is turned to the base and the substrate 101 is removed through a physical and/or chemical process. The physical removing process is a laser lift off (LLO) process that irradiates a laser beam with a predetermined wavelength onto the substrate 101 to separate the substrate 101 from the first conductivity type semiconductor layer 110. If another semiconductor layer (e.g., a buffer layer) is formed between the substrate 101 and the first conductivity type semiconductor layer 110, the buffer layer and the substrate 101 may be removed using a wet etchant. An ICP/RIE (Inductively coupled Plasma/Reactive Ion Etching) process may be performed on the surface of the first conductivity type semiconductor layer 110 removed of the substrate 101.

Referring to FIGS. 5 and 6, a mesa etching process is performed on an inter-chip boundary region (i.e., a channel region). At this point, the outer circumference of the light-emitting structure 135 is etched to a cylindrical shape. That is, the outer edge of the second conductivity type semiconductor layer 130 from the first conductivity type semiconductor layer 110 is etched to a cylindrical shape. The etching process may be a dry and/or wet etching process using a mask pattern.

Each of the first conductivity type semiconductor layer 110, the active layer 120 and the second conductivity type semiconductor layer 130 may be formed in the shape of a disk. The outer circumference of the light-emitting structure 135 may be formed to be slant or perpendicular to the growth surface of the semiconductor layer, or may be formed in the shape of a cylinder.

The outer circumference of the light-emitting structure 135 may be inclined. Accordingly, the first conductivity type semiconductor layer 110 may be formed to have the smallest diameter, or the second conductivity type semiconductor layer 130 may be formed to have the largest diameter.

A first electrode pad 115, a first pattern 116 and a second pattern 117, which serves as a first electrode unit, may be formed on the first conductivity type semiconductor layer 110 as illustrated in FIG. 2. Referring to FIG. 2, the first electrode pad 115 is formed in singularity or in plurality, and is electrically connected to the first pattern 116 and the second pattern 117. The first pattern 116 may be branched from the first electrode pad 115 in a branch shape, a finger shape or radiation shape. The second pattern 117 may be formed along the outer shape of the first conductivity type semiconductor layer 110, and may be formed in the shape of a circular pattern or a loop pattern. The second pattern 117 may be formed to have a smaller diameter than the first conductivity type semiconductor layer 110. Herein, the second pattern 117 may be formed to have a continuous pattern or discontinuous patterns.

The light-emitting structure 135 can prevent a current concentration by the first electrode pad 115, the first pattern 116 and the second pattern 117. Also, the active layer 120 is formed in the shape of a disk, thereby making it possible to improve the internal quantum efficiency and the reliability of the chip.

FIGS. 7 to 11 are sectional views illustrating a process for fabricating a semiconductor light-emitting device according to an embodiment 2. In describing the embodiment 2, a description of an overlap with the embodiment 1 will be omitted for conciseness.

Figure 7:
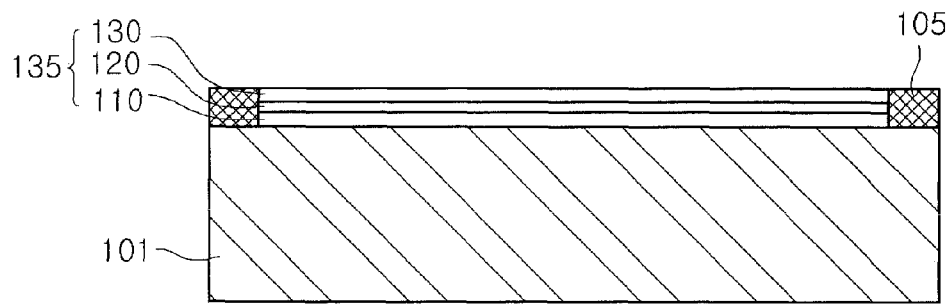
FIGS. 7 to 11 are sectional views illustrating a process for fabricating a semiconductor light-emitting device according to an embodiment 2.

Referring to FIG. 7, a circular thin layer 105 is formed along an outer edge on a substrate 101, and semiconductor layers 110, 120 and 130 of a light-emitting structure 135 is formed inside the circular thin layer 105. The circular thin layer 105 may be formed in a circular or ring shape, or may be formed in the shape of a pillar with rounded polygonal edges.

The circular thin layer 105 may be formed of a dielectric material, for example, at least one of $SiO_2$, $Si_3N_4$, $Al_2O_3$, and $TiO_2$. The circular thin layer 105 may be formed to have about the same thickness of the light-emitting structure 135.

A first conductivity type semiconductor layer 110, an active layer 120, and a second conductivity type semiconductor layer 130 are sequentially stacked on the substrate 101. The semiconductor layers 110, 120 and 130 may be formed in the shape of a disk because they are formed in the circular thin layer 105.

Figure 8:
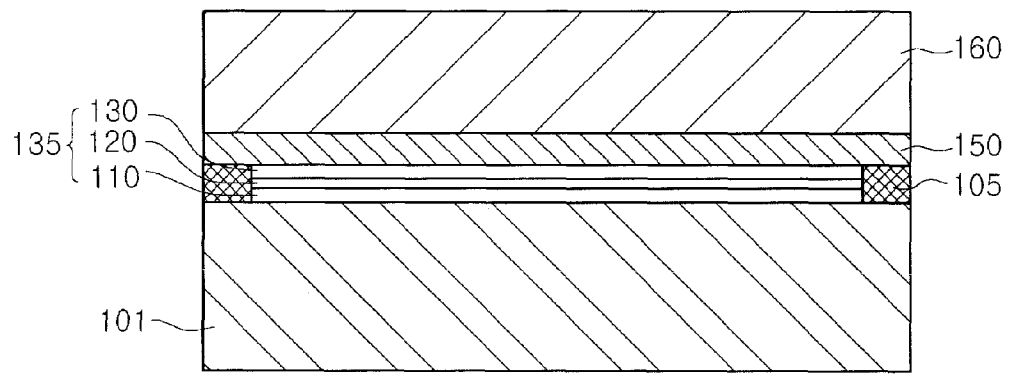

Referring to FIG. 8, a second electrode layer 150 and a conductive support member 160 are sequentially stacked on the second conductivity type semiconductor layer 130 and the circular thin layer 105. The second conductivity type semiconductor layer 150 and the conductive support member 150 may be identical to those of the embodiment 1, and an ohmic contact layer may be formed between the second electrode layer 150 and the second conductivity type semiconductor layer 130, to which the inventive concept is not limited.

Figure 9:
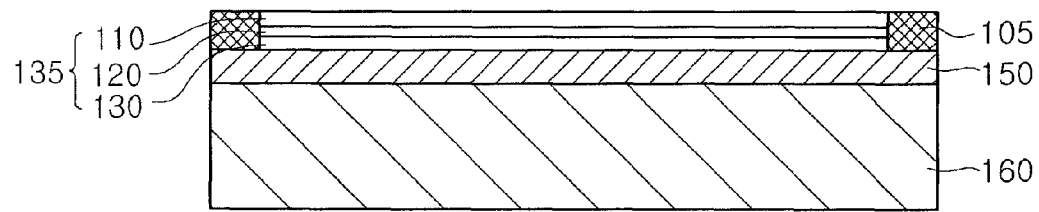

Referring to FIGS. 8 and 9, the conductive support member 160 is turned to the base, and the substrate 101 is removed through a physical and/or chemical process. For example, the substrate 101 may be removed through a laser lift off (LLO) process. When the substrate 101 is removed, the first conductivity type semiconductor layer 110 and the circular thin layer 105 are exposed.

Figure 10:
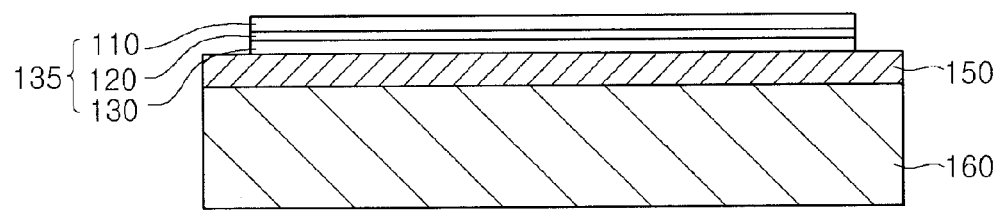

Referring to FIGS. 9 and 10, the circular thin layer 105 may be removed. The circular thin layer 105 may be etching through a wet and/or dry etching process, to which the inventive concept it not limited. If the circular thin layer 105 is formed of a transparent dielectric material, it may not be etched or removed completely.

The first conductivity type semiconductor layer 110, the active layer 120, and the second conductivity type semiconductor layer 130 may be formed in the shape of a disk. Herein, the semiconductor layers 110, 120 and 130 may be formed to have the same diameter. The light-emitting structure 135 may be disposed on the second electrode layer 150 in the shape of a cylinder. Also, an outer side of the second electrode layer 150 may be extended outward from the outer circumference of the semiconductor layers 110, 120 and 130 and exposed to the outer side of the semiconductor layers 110, 120 and 130.

Figure 11:
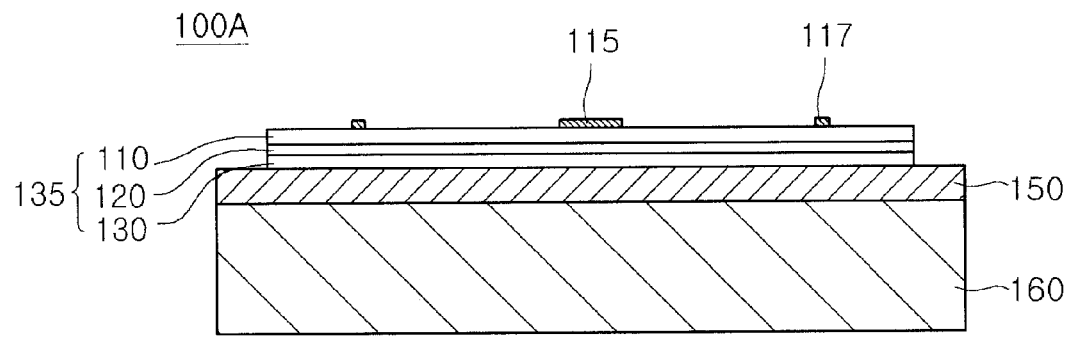

Referring to FIG. 11, a first electrode pad 115, a first pattern 116 and a second pattern 117, which serves as a first electrode unit, may be formed on the first conductivity type semiconductor layer 110 as illustrated in FIG. 2.

In a semiconductor light-emitting device 100A, a cylindrical light-emitting structure 135 and a circular second pattern 117 may be formed on the second electrode layer 150. Accordingly, the light-emitting device 100A can supply a uniform current and improve the internal quantum efficiency and the far field beam distribution.

Figure 12:
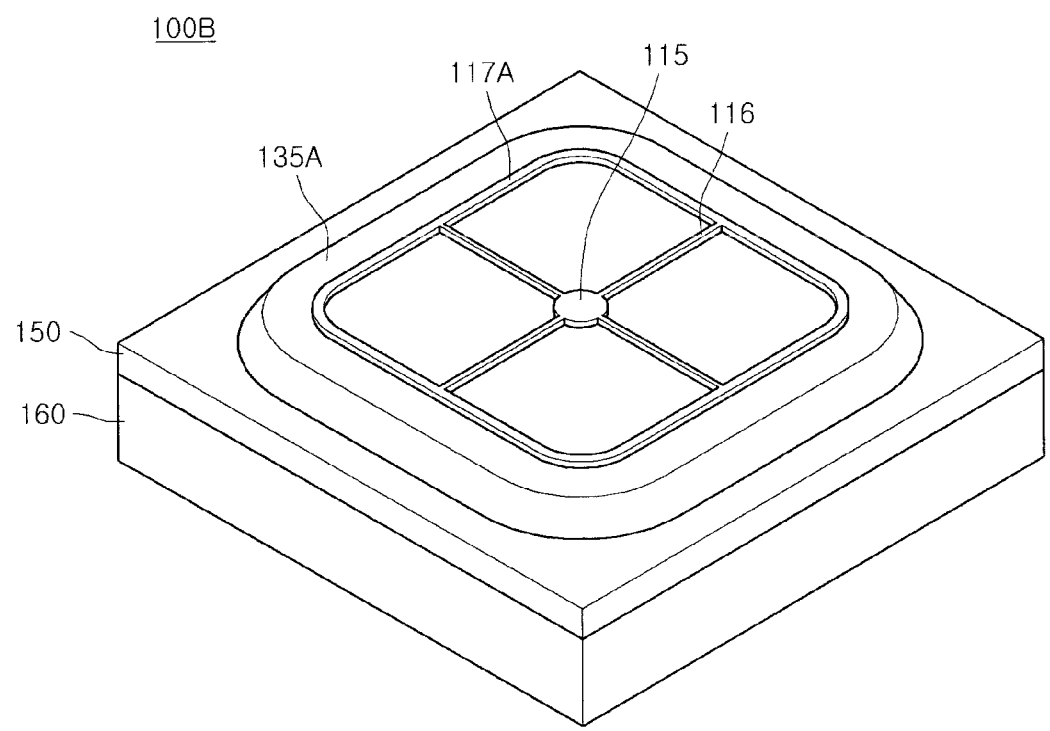
FIG. 12 is a perspective view of a semiconductor light-emitting device according to an embodiment 3.
Figure 13:
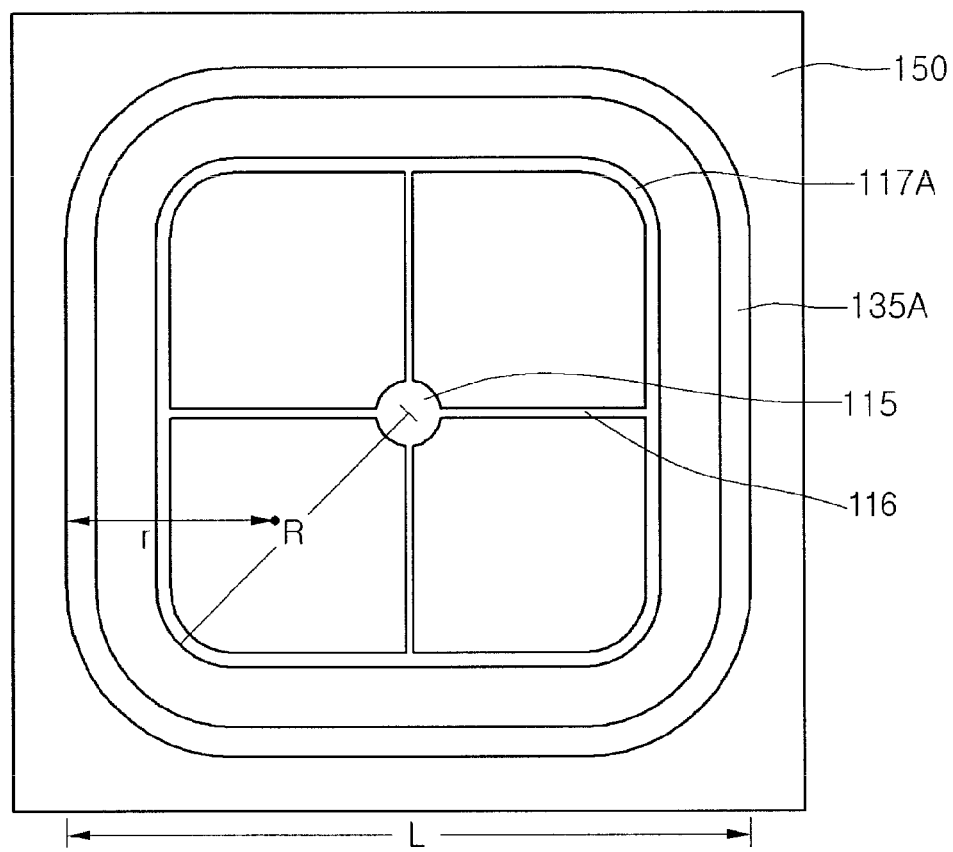
FIG. 13 is a plan view of the semiconductor light-emitting device of FIG. 12.

FIG. 12 is a perspective view of a semiconductor light-emitting device according to an embodiment 3, and FIG. 13 is a plan view of the semiconductor light-emitting device of FIG. 12. In describing the embodiment 3, a description of an overlap with the embodiment 1 will be omitted for conciseness.

Referring to FIGS. 12 and 13, a semiconductor light-emitting device 100B includes a pillar-type or cylindrical light-emitting structure 135A on a second electrode layer 150, which has at least one rounded edge. For example, the light-emitting structure 135A may be formed in the shape of a tetragonal pillar with four edges chamfered, and may be formed to have a slant or perpendicular outer circumference.

Herein, the radius of a circle from the center of the light-emitting structure 135A to an edge of the light-emitting structure 135A is R, and the radius 'r' may be about ½ of the radius R of the circle or may be about ¼ to ½ of the length L of one side of a square. Herein, the radius R of the circle may be the distance from the chip center to the top edge of the light-emitting structure or the edge of the second pattern 117.

The light-emitting structure 135A may have an outer circumference with the shape of a tetragonal pillar and each edge chamfered, thereby making it possible to improve the area of an active layer (not illustrated) and the far field beam distribution in comparison with the embodiment 1.

Herein, a first pattern 116 is connected to the first electrode pad 115, and a second pattern 117A is connected to the first pattern 116. The second pattern 117A has tetragonal edges rounded and may be formed in the same shape as the outer circumference of the light-emitting structure 135. The power supplied to the first electrode pad 115 may be uniformly diffused through the first and second patterns 116 and 117A to the entire region, and may be uniformly supplied to the first conductivity type semiconductor layer.

Figure 14:
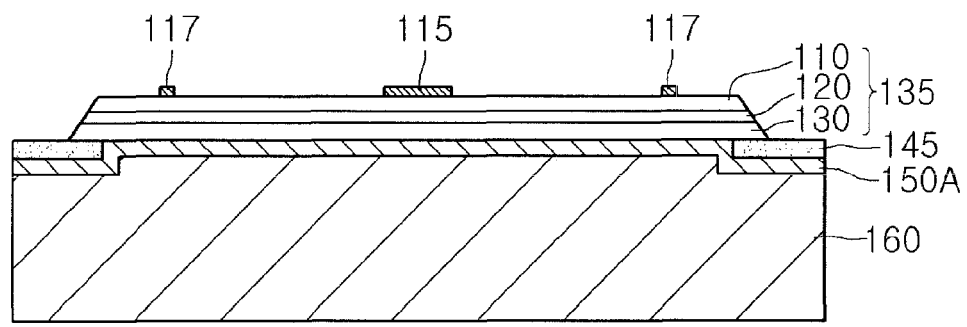
FIG. 14 is a sectional view of a semiconductor light-emitting device according to an embodiment 4.

FIG. 14 is a sectional view of a semiconductor light-emitting device according to an embodiment 4. In describing the embodiment 4, a description of an overlap with the embodiment 1 will be omitted for conciseness.

Referring to FIG. 14, a semiconductor light-emitting device 100C includes a channel layer 145 around a region between a second electrode layer 150A and the light-emitting structure 135.

The channel layer 145 may be formed along the top edge of the second electrode layer 150A in the shape of a ring, a loop or a continuous frame to a predetermined thickness. The channel layer 145 may serve to separate the second electrode layer 150A and the semiconductor layers 110, 120 and 130 of the light-emitting structure 135.

The channel layer 145 may include an oxide-based or nitride-based material, for example, $SiO_2$, $SiO_x$, $SiO_xN_y$, $Si_3N_4$, $Al_2O_3$, $TiO_2$, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), or GZO (gallium zinc oxide). Also, the channel layer 145 may be formed of a material that transmits laser beams or is hardly fragmented by laser beams.

The channel layer 145 may serve to separate the conductive support member 160 and the second conductivity type semiconductor layer 130, thus preventing an inter-layer short at the outer walls of the semiconductor layers 110, 120 and 130 that may be caused by the above fragments.

An embodiment provides a lateral type semiconductor light-emitting device or a vertical type semiconductor light-emitting device having a pillar-type or cylindrical light-emitting structure.

Figure 15:
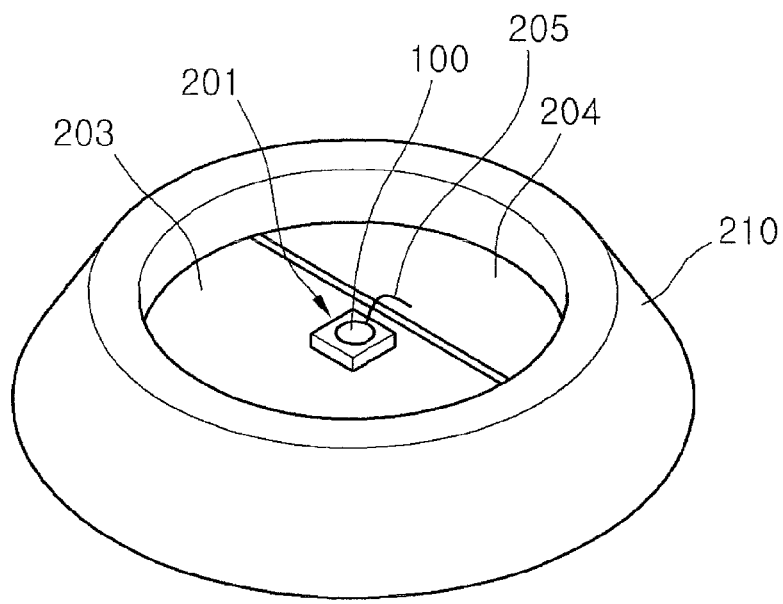
FIG. 15 is a perspective view of a light-emitting device package according to an embodiment 5.

FIG. 15 is a perspective view of a light-emitting device package according to an embodiment 5.

Referring to FIG. 15, a light-emitting device package 200 includes a package body 210, a cavity 201, a plurality of lead electrodes 203 and 204, and a semiconductor light-emitting device 100. The package body 210 may be formed of a resin material such as a silicon material or polyphthalamide (PPA).

The opened cavity 201 is defined in an upper portion of the package body 210. For example, the cavity 201 may have a cylindrical shape or a rounded shape. The plurality of lead electrodes 203 and 204 may be disposed in the cavity 201.

The semiconductor light-emitting device 100 may be attached to any one electrode 203 of the plurality of lead electrodes 203 and 204 using a conductive adhesive or die-bonded to any one electrode 203 of the plurality of lead electrodes 203 and 204. The semiconductor light-emitting device 100 is electrically connected to the other electrode 204 using a wire. The light-emitting structures of the previously described embodiments may be selectively applicable to the semiconductor light-emitting device 100.

In the light-emitting device package 200, since the semiconductor light-emitting device 100 includes a light-emitting structure having a cylindrical shape or a chamfered column shape, the semiconductor light-emitting device 100 may uniformly emit light in a hemispheric shape.

Figure 16:
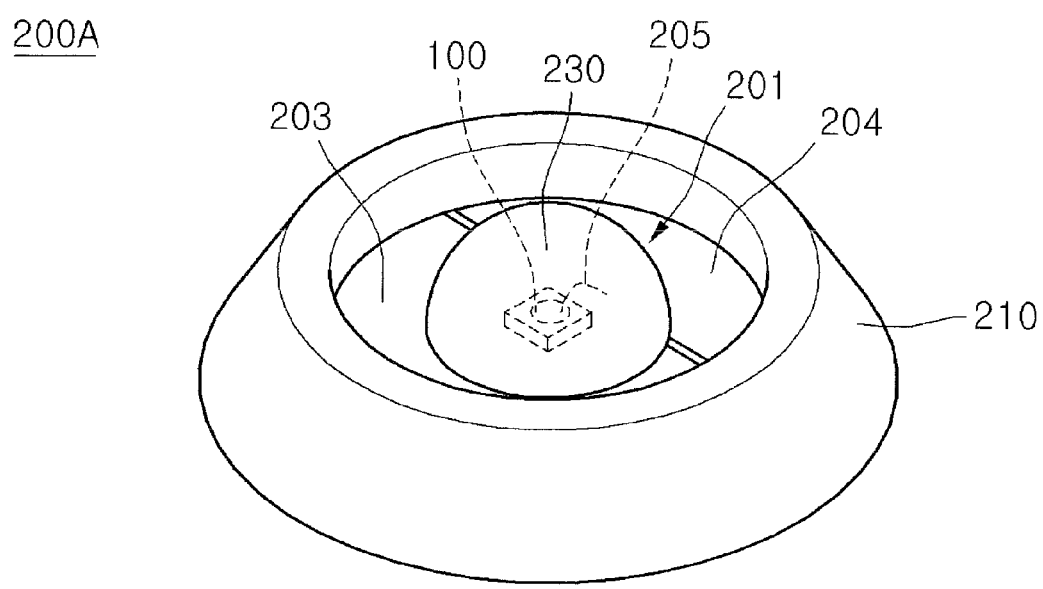
FIG. 16 is a perspective view illustrating another embodiment of the light-emitting device package of FIG. 15.

FIG. 16 is a perspective view illustrating another embodiment of the light-emitting device package of FIG. 15.

Referring to FIG. 16, a semiconductor light-emitting device 100 may be mounted within a cavity 201 of a light-emitting device package 200A. A resin material 230 is disposed on the semiconductor light-emitting device 100.

The resin material 230 may include a transparent resin material such as silicon or epoxy. The resin material 230 may have a hemispheric shape. At least one kind of phosphor may be added to the resin material 230.

In the semiconductor light-emitting device 100, light emission may be improved by the light-emitting structures of the previously described embodiments. Thus, a far field beam distribution characteristic of the light-emitting device package 200A may be improved.

A method of manufacturing a semiconductor light-emitting device includes forming a light-emitting structure including a plurality of compound semiconductor layers on a substrate, forming a second electrode layer on the plurality of compound semiconductor layers, forming a conductive support member on the second electrode layer, removing the substrate, etching at least portion of an outer circumference of the light-emitting structure to form the light-emitting structure having a rounded shape, and forming a first electrode pad and a pattern connected to the first electrode pad on the light-emitting structure.

Embodiments can improve the current distribution by using the second pattern having a shape corresponding to that of the surface of the light-emitting structure.

Embodiments can improve the internal quantum efficiency.

Embodiments can improve the far field beam distribution characteristic by the light-emitting structure having the cylindrical or rounded shape.

Embodiments can improve the reliability of the semiconductor light-emitting device.

Embodiments can improve light efficiency.

Embodiments can provide a vertical-type semiconductor light-emitting device in which an outer circumference of a semiconductor layer has a spherical shape.

Embodiments can provide a light emitting diode (LED) package.

Embodiments can be applicable to light sources for a display device, a streetlight, and an illumination device.

Embodiments can improve reliability of an LED chip and a package.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light-emitting device comprising:
   a light-emitting structure that includes a plurality of compound semiconductor layers, at least one of the plurality of compound semiconductor layers including an active layer, and the light-emitting structure having a rounded side surface;
   a first electrode unit on the light-emitting structure;
   a second electrode layer under the light-emitting structure; and
   a channel layer around a region between the second electrode layer and the light-emitting structure,
   wherein the channel layer has a top surface and a bottom surface, and a portion of the top surface of the channel layer has an exposed surface and an unexposed surface opposite to each other, the unexposed surface overlapping a portion of the active layer, and
   wherein a first thickness between the exposed surface and the bottom surface is substantially identical to a second thickness between the unexposed surface and the bottom surface.

2. The semiconductor light-emitting device according to claim 1, wherein the light-emitting structure is provided in a pillar shape.

3. The semiconductor light-emitting device according to claim 1, wherein the channel layer comprises at least one of $SiO_2$, $SiO_x$, $SiO_xN_y$, $Si_3N_4$, $Al_2O_3$, $TiO_2$, ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), and GZO (gallium zinc oxide).

4. The semiconductor light-emitting device according to claim 1, wherein the light-emitting structure comprises a Group III-V compound semiconductor and comprises:
   a first conductivity type semiconductor layer under the first electrode unit;
   the active layer under the first conductivity type semiconductor layer; and
   a second conductivity type semiconductor layer between the active layer and the second electrode layer.

5. The semiconductor light-emitting device according to claim 4, further comprising at least one of a third conductivity type semiconductor layer, a non-metallic layer and an ohmic layer between the second conductivity type semiconductor layer and the second electrode layer.

6. The semiconductor light-emitting device according to claim 4, wherein a first pattern branches outward from a first electrode pad in at least one shape, and a second pattern is formed in a circular shape or in a same shape as an outer shape of the first conductivity type semiconductor layer.

7. The semiconductor light-emitting device according to claim 1, further comprising a conductive support member under the second electrode layer.

8. A semiconductor light-emitting device comprising:
   a cylindrical light-emitting structure that includes a plurality of compound semiconductor layers, at least one of the plurality of compound semiconductor layers including an active layer;
   a polygonal second electrode layer under the light-emitting structure;
   a channel layer around a region between the polygonal second electrode layer and the cylindrical light-emitting structure;
   a first electrode pad on the light-emitting structure; and
   a circular pattern disposed along a top edge of the light-emitting structure and being connected electrically to the first electrode pad,
   wherein the circular pattern has a rounded shape that is spaced apart by substantially a same first distance from a side surface of the cylindrical light-emitting structure, and the circular pattern having the rounded shape is spaced apart by a second distance from the first electrode pad, the second distance being greater than the first distance, and
   wherein the channel layer has a top surface and a bottom surface, and a portion of the top surface of the channel layer has an exposed surface and an unexposed surface opposite to each other, the unexposed surface overlapping a portion of the active layer, and
   wherein a first thickness between the exposed surface and the bottom surface is identical to a second thickness between the unexposed surface and the bottom surface.

9. The semiconductor light-emitting device according to claim 8, wherein the light-emitting structure comprises a Group III-V compound semiconductor and comprises:
   an N-type semiconductor layer under the first electrode pad;
   the active layer under the N-type semiconductor layer; and
   a P-type semiconductor layer under the active layer.

10. The semiconductor light-emitting device according to claim 8, wherein the second electrode layer comprises a reflective metal having a polygonal plate shape, and the light-emitting device comprises a conductive support member under the second electrode layer.

11. The semiconductor light-emitting device according to claim 9, wherein the compound semiconductor layers comprise disk shapes with a same diameter or different diameters.

12. The semiconductor light-emitting device according to claim 9, further comprising a transparent channel layer at an outer edge between the P-type semiconductor layer and the second electrode layer, and the channel layer comprises at least one of an oxide-based material or a nitride-based material.

13. The semiconductor light-emitting device according to claim 8, wherein an outer side of the second electrode layer extends outward from an outer side of the light-emitting structure.

14. The semiconductor light-emitting device according to claim 9, wherein the P-type semiconductor layer has a larger diameter than the N-type semiconductor layer.

15. A light-emitting device package comprising:
    a light-emitting device comprising:
        a cylindrical light-emitting structure that includes a first conductivity type semiconductor layer, an active layer and a second conductivity type semiconductor layer;
        a second electrode layer under the second conductivity type semiconductor layer;
        a channel layer around a region between the second electrode layer and the cylindrical light-emitting structure; and
        a first electrode unit on the first conductivity type semiconductor layer;
    a body unit having an opened cavity at a top of the body unit, and
    a plurality of lead electrodes disposed in the cavity of the body unit and connected electrically to the first electrode unit and the second electrode layer,
    wherein the channel layer has a top surface and a bottom surface, and a portion of the top surface of the channel layer has an exposed surface and an unexposed surface opposite to each other, the unexposed surface overlapping a portion of the active layer, and
    wherein a first thickness between the exposed surface and the bottom surface is substantially identical to a second thickness between the unexposed surface and the bottom surface.

16. The light-emitting device package according to claim 15, further comprising a resin material formed in the cavity.

17. The semiconductor light-emitting device according to claim 4, wherein a portion of the channel layer does not vertically overlap the first conductivity type semiconductor layer.

18. The semiconductor light-emitting device according to claim 4, wherein a diameter of the active layer is greater than a diameter of the first conductivity type semiconductor layer, and a diameter of the second conductivity type semiconductor layer is greater than a diameter of the active layer.

19. The semiconductor light-emitting device according to claim 4, wherein an edge portion of the second electrode layer is disposed at a position lower than the second conductivity type semiconductor layer.

20. The semiconductor light-emitting device according to claim 1, wherein the first electrode unit comprises:
    a first electrode pad on the light-emitting structure;
    a first pattern branched from the first electrode pad; and
    a second pattern coupled to an end of the first pattern and that encircles the first electrode pad,
    wherein the second pattern of the first electrode unit has a rounded shape that is spaced apart by substantially a same first distance from the rounded side surface of the light-emitting structure, and the second pattern having the rounded shape is spaced apart by a second distance from the first electrode pad, the second distance being greater than the first distance.

* * * * *